US008271810B1

(12) United States Patent
Fliesler et al.

(10) Patent No.: US 8,271,810 B1
(45) Date of Patent: Sep. 18, 2012

(54) METHOD AND APPARATUS FOR DYNAMICALLY DETECTING ENVIRONMENTAL CONDITIONS AND ADJUSTING DRIVE STRENGTH IN RESPONSE TO THE DETECTING

(75) Inventors: Michael Fliesler, Santa Cruz, CA (US); David Lindley, Starkville, MS (US); Morgan Whately, San Francisco, CA (US); Vinod Rajan, Starkville, MS (US); Muthukumar Nagarajan, Starkville, MS (US); Jun Li, Fremont, CA (US); Jeffery Hunt, Ackerman, MS (US)

(73) Assignee: Cypress Semiconductor Corporation, San Jose, CA (US)

( * ) Notice: Subject to any disclaimer, the term of this patent is extended or adjusted under 35 U.S.C. 154(b) by 445 days.

(21) Appl. No.: 12/509,249

(22) Filed: Jul. 24, 2009

(51) Int. Cl.
*G06F 1/32* (2006.01)
(52) U.S. Cl. ........ 713/300; 713/310; 713/320; 713/321; 713/322; 713/323; 713/324; 713/330; 713/340
(58) Field of Classification Search ............... 713/300, 713/310, 320–324, 330, 340
See application file for complete search history.

(56) References Cited

U.S. PATENT DOCUMENTS

| 6,509,780 | B1 | 1/2003 | Lim et al. | |
|---|---|---|---|---|
| 6,717,455 | B2 | 4/2004 | Mughal et al. | |
| 6,750,683 | B2 | 6/2004 | McClure et al. | |
| 6,756,810 | B2 | 6/2004 | Mughal et al. | |
| 6,943,588 | B1 * | 9/2005 | Luo et al. | 326/86 |
| 7,366,275 | B2 * | 4/2008 | Lee et al. | 377/82 |
| 7,675,326 | B1 * | 3/2010 | Luo et al. | 326/86 |
| 2004/0165693 | A1 * | 8/2004 | Lee et al. | 377/94 |
| 2006/0220698 | A1 * | 10/2006 | Chen et al. | 327/108 |
| 2006/0227927 | A1 * | 10/2006 | Lee et al. | 377/82 |

FOREIGN PATENT DOCUMENTS

EP 1294097 A2 3/2006

OTHER PUBLICATIONS

"High Speed, Low Power Wide Supply Range Amplifier," Analog Devices Inc., 1995, AD817, pp. 1-12; 12 pages.
"Microwire Serial Interface," AN-452, 1995 National Semiconductor Corporation, Jan. 1992, TL/DD/8796, pp. 1-12: 12 pages.

* cited by examiner

*Primary Examiner* — M Elamin

(57) ABSTRACT

Disclosed is a dynamic detector to detect an environmental condition including a power-supply level relative to a predetermined threshold signal during a training phase; and an adjustable buffer, coupled with the dynamic detector, configured to adjust output drive strength during the training phase in response to the detected environmental condition.

27 Claims, 5 Drawing Sheets

METHOD AND APPARATUS FOR DYNAMICALLY DETECTING ENVIRONMENTAL CONDITIONS AND ADJUSTING DRIVE STRENGTH IN RESPONSE TO THE DETECTING

TECHNICAL FIELD

Embodiments of the invention are related to the field of semiconductor devices and, in particular, detecting environmental conditions of a processor and adjusting drive strength of output drivers in response to the detecting.

BACKGROUND

Semiconductor devices, which are used for integrated circuits, such as processors, include output buffers that interface other devices. Traditionally output buffers may be designed for a narrow power-supply range. For example, a narrow power-supply range may be a range of approximately 0.9 volts (V) to 1.2V of power supply, or specified as a voltage tolerance about a nominal voltage (e.g.: 5.0V+/−10%). Certain characteristics of these output buffers, also called output drivers, such as slew rate, and output impedance, may be compensated for a narrow power-supply range. Such output drivers may be used as interfaces with other devices having comparable power-supply ranges. For example, an output driver of a processor which is designed to operate at a power-supply range of approximately 0.9-1.2V may not interface with another processor having an input/output (I/O) buffer that operates at 5 volts.

BRIEF DESCRIPTION OF THE DRAWINGS

The invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
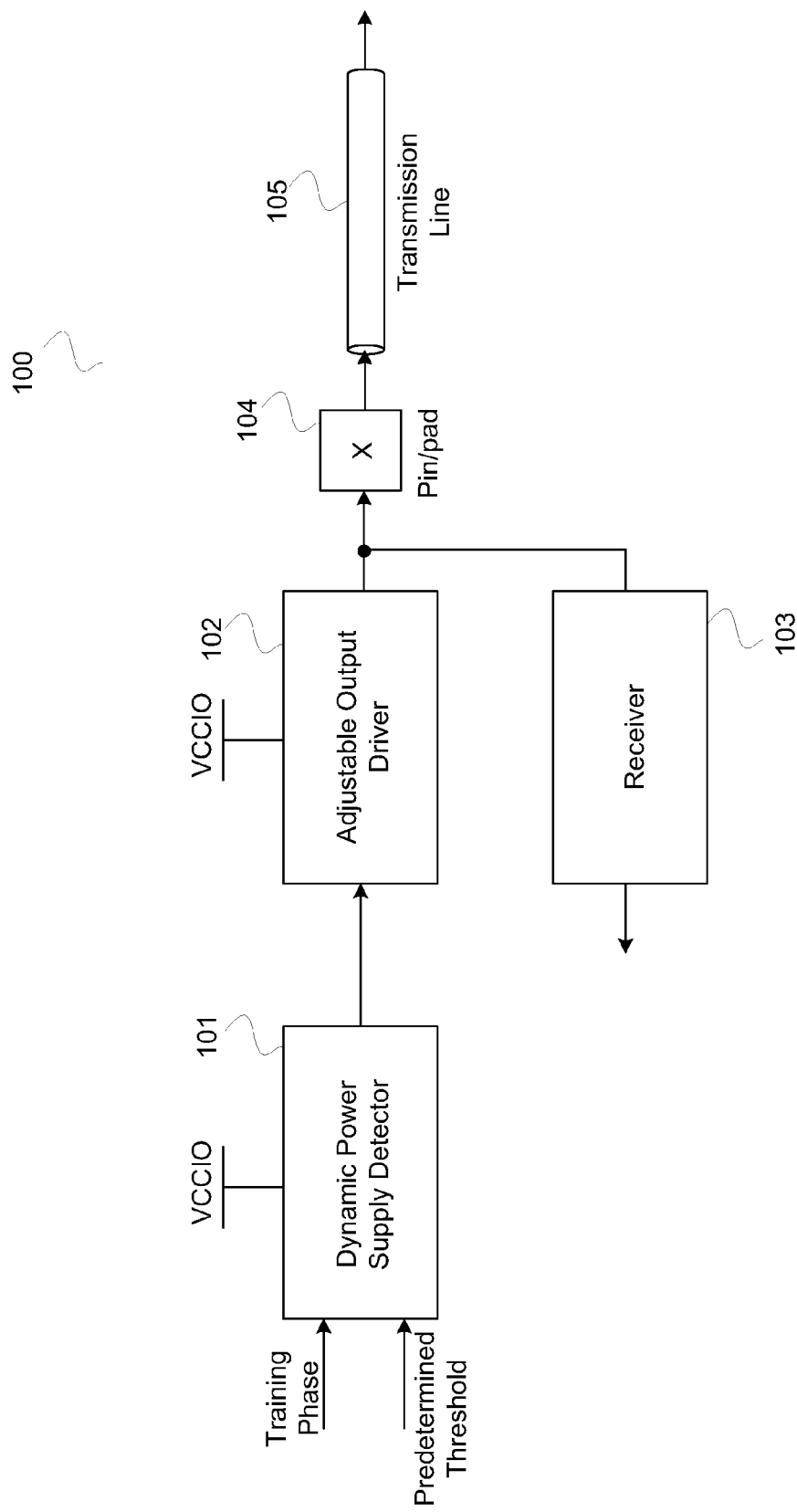
FIG. 1 illustrates a high-level block diagram of an adjustable output driver coupled with a dynamic power supply detector according to an embodiment of the invention.

In the following description, numerous details are set forth. It will be apparent, however, to one of ordinary skill in the art having the benefit of this disclosure, that the present embodiments may be practiced without these specific details. In some instances, well-known structures and devices are shown in block diagram form, rather than in detail, in order to avoid obscuring the present embodiments. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments.

The alternating current (AC) and direct current (DC) performance characteristics of a buffer, such as an output buffer of a processor, are sensitive to environmental conditions, such as, for example, power-supply voltage and temperature. The performance characteristics may also depend on other environmental conditions. When an output buffer is designed to generate signals with a certain slew rate, for example, a slew rate of 1.5 ns (determined at 20%-80% voltage points of the signal), to operate at 5.0V power supply, then such an output buffer may not generate the same slew rate (i.e., 1.5 ns in this example) at a lower power-supply voltage. In other words, the output buffer now operating at a lower power supply (e.g., 1.65V) will generate a slower slew rate, for example, 10 ns (determined at 20%-80% points), than the slew rate of 1.5 ns at 5.0V power supply.

Conversely, an output buffer designed to generate a specified slew rate (i.e., 1.5 ns) at a lower power-supply voltage (i.e., 1.65v) would generate a much higher slew rate (much less than 1.5 ns, perhaps 300 ps) at a higher power-supply voltage (i.e., 5V). A higher slew rate may generate higher noise (such as ground bounce, overshoot, undershoot, di/dt) on the driven and neighboring transmission lines. To mitigate the noise effects of higher slew rates caused by a much higher power-supply voltage, the output driver's drive strength may be adjusted to generate a lower slew rate. For example, when raising the power supply to a higher power-supply voltage level, such as 5V, from a lower supply level, such as 1.65V, the output driver's drive strength may be adjusted from 300 ps to 1.5 ns. In one embodiment, a dynamic power supply detector is used to detect changing power-supply levels. In one embodiment, the power-supply levels range from approximately 1.65V to 5.6V. Alternatively, other power-supply level ranges may be used. The detected information may then be used to adjust the output driver's drive strengths according to the noise envelope and other parameters of an interface connected with the output buffer. The dynamic power supply detector, along with the adjustable output driver, allows for a single device (such as an EEPROM) to interface with multiple device interfaces (such as, for example, SPI, I²C, Microwire, UNI/O, 1-Wire, 12C, etc.) operating over a wide range of power-supply levels (such as approximately 1.6V-5.6V). Using the dynamic power supply detector, a single die can be used for wide supply ranges in some embodiments. In other embodiments, the dynamic power supply detector can be used for multiple power-supply ranges.

In one embodiment, the dynamic power supply detector detects a power-supply voltage on every read cycle (also referred to herein as reading phase), such as, during the initial part of the read cycle. In one embodiment, the dynamic power supply detector includes a comparator to detect the power-supply voltage, and a latch to latch the comparator's output, allowing the drive strength of the output driver to be set prior to the output driver becoming active. The dynamic power supply detector, including the comparator, may then be deselected to not consume power while not active. In one embodiment, because the power-supply voltage is sampled on every read cycle, the dynamic power supply detector consumes power during a limited duty cycle, which reduces active power and consumes no standby power, or very little standby power. In one embodiment, the comparator is designed to for relatively low accuracy, which can simplify circuit design and reduce the area for the circuitry on the semiconductor device. Embodiments of the dynamic power supply detector, as described herein, may reduce the size and complexity of the output buffer design. The embodiments described herein may consume less area, and may provide a wide power-supply operating range. The embodiments described herein may be used for high speed circuitry and may have low output switching noise.

FIG. 1 illustrates a high-level block diagram 100 of a power supply adjustable output buffer according to one embodiment of the invention. Block 101 represents a dynamic power supply detector. In one embodiment, the dynamic power supply detector 101 detects a power-supply level, VCCIO, during a training phase and compares a divided version of VCCIO with a predetermined threshold signal or voltage reference VREF. The output of the detector 101 may then configure the adjustable output driver 102 (also operating on VCCIO) to raise or lower its drive strength appropriately. In one embodiment, the dynamical power supply detector 101 receives a training phase signal to enable the dynamic power supply detector 101. The training phase signal may be received for other circuitry, such as control circuitry of a processor of a semiconductor device. The dynamic power supply detector 101 may receive the predetermined threshold signal or voltage reference from a reference generator. Alternatively, the dynamic power supply detector 101 may receive the predetermined threshold from other circuitry of the semiconductor device. Such alternative other circuitry and reference generators to generate a threshold signal are known in the art; accordingly, further details are not provided.

This configuration may be done when the adjustable output driver 102 is in a training phase including a reading phase, for example, when the receiver 103 is receiving incoming data. The output driver 102 is then configured to transmit signals at appropriate slew rates when it enters its active drive phase, for example, during the latter part of the reading phase. In the depicted embodiment, the output buffer 102 drives a signal to be transmitted on transmission line 105 via pad/pin 104. The depicted embodiment also includes a receiver 103 that receives signals from the transmission line 105 via the pad/pin 104.

In other embodiments, the dynamic power supply detector 101 may also detect a multi-level range of power supplies. For example, the dynamic power supply detector 101 may detect a multi-level range of 1.5V-2.0V, 2.0V-2.6V, 2.6-V-3.6V, and 3.6V-5.5V. Detection of other power-supply ranges is possible by, for example, optimizing the comparator design which is discussed below.

The dynamic power supply detector 101, in one embodiment, detects the power-supply voltage level or voltage range on a sampled basis. This non-continuous power-supply detection by the dynamic power supply detector 101 allows for low active power dissipation i.e. power savings. For example, the dynamic power supply detector 101, in one embodiment, detects the power-supply level or range every 10 ms. Alternatively, the dynamic power supply detector 101 may detect the power-supply level or range at other time intervals.

Figure 2:
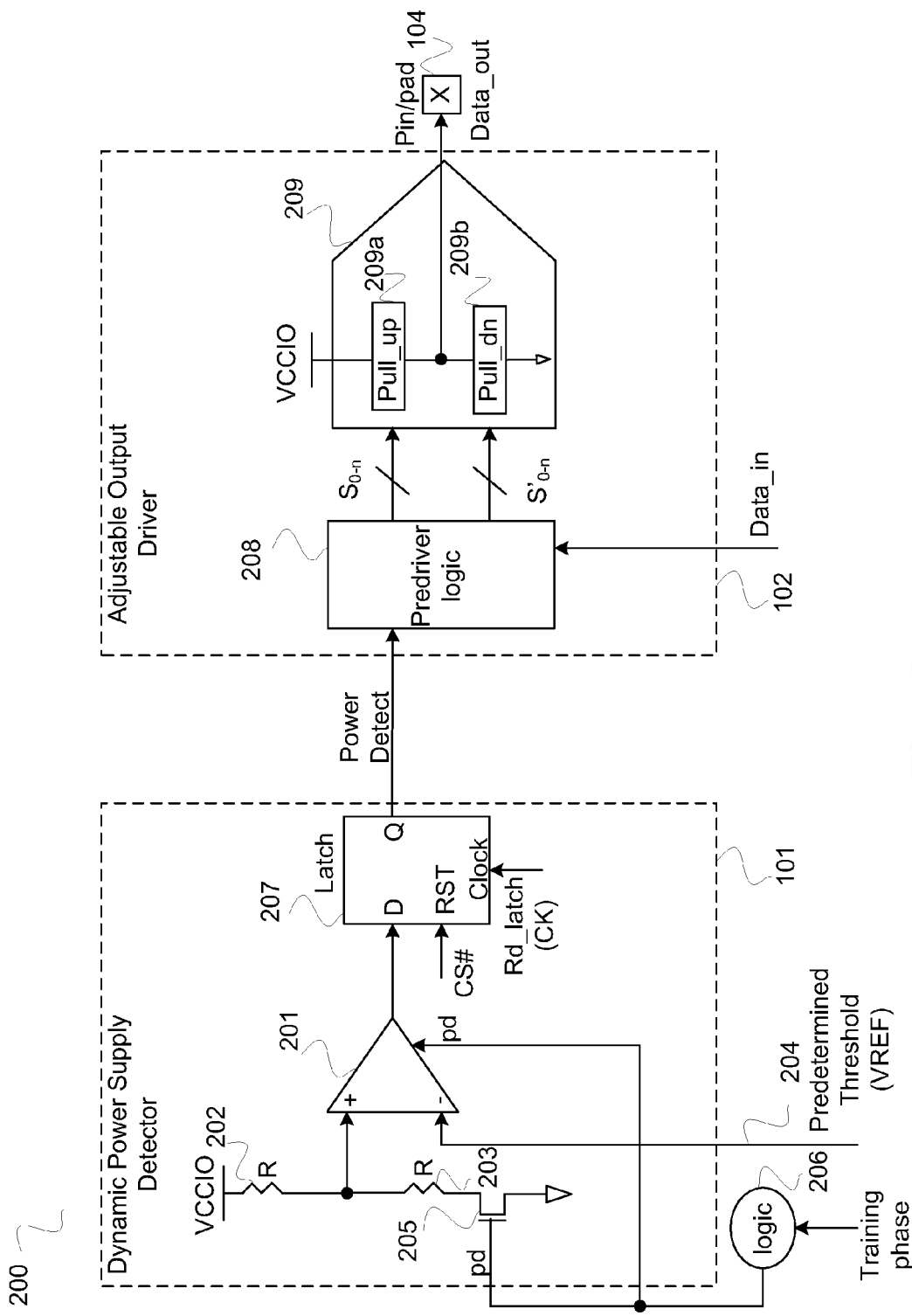
FIG. 2 illustrates functional details of the high-level block diagram according to an embodiment of the invention.

FIG. 2 illustrates functional details, as circuit and logic blocks 200, of the high-level block diagram 100 according to one embodiment of the invention. The dynamic power supply detector 101, according to one embodiment, includes a comparator 201, a power-supply divider having resistors 202 and 205, a latch 207 to store in the comparator output in response to a certain power-supply level of VCCIO, and logic 206 to detect beginning and ending of a training phase to power down the dynamic power supply detector 101. In the depicted embodiment, the logic 206 resides outside of the dynamic power supply detector. In other embodiments, the logic 206 may be integrated with the circuitry of the dynamic power supply detector. The latch 207 may be used to sample the output of the comparator 201. This method of sampled power-supply detection achieves lower active power-supply current.

The resistors 202 and 203, in one embodiment, are of equal values. In such an embodiment, VCCIO is divided by two for comparison by the comparator 201. In other embodiments, the resistors 202 and 203 may have different values. While the voltage divider shown in FIG. 2 is implemented by resistor dividers, other devices for voltage division may be used. In one embodiment, the resistors 202 and 203 have predetermined values. The predetermined value, in one embodiment, is 1K Ohm. In another embodiment, the resistor divider has resistors that are programmable or trim-able to a range of resistor values to change the comparator input associated with the power supply VCCIO. Likewise, more than two resistors (or other devices) may be used for voltage division. In other embodiments, the power supply may be sampled using other types of circuits as would be appreciated by one of ordinary skill in the art having the benefit of this disclosure.

It should be noted that although the dynamic power supply detector 101 detects the power-supply voltage, in other embodiments, the dynamic power supply detector 101 detects other environmental conditions, such as temperature. In one embodiment, the dynamic power supply detector 101 includes temperature sensing circuitry to be used to set the drive strength of the adjustable output driver 102. Alternatively, the dynamic power supply detector 101 may include other circuitry to detect other environmental conditions, such a humidity, as would be appreciated by one of ordinary skill in the art having the benefit of this disclosure.

In one embodiment, a power down transistor 205 is used to turn on or off the dynamic power supply detector 101. In one embodiment, the power down transistor 205 receives a power down (pd) signal from the logic 206 based on the training phase signal. In another embodiment, the training phase signal may be provided directly to the power down transistor as the power down signal. The comparator 201 receives and compares a predetermined threshold 204 with a divided power-supply level, which is generated by the voltage divider described above. The comparator 201 may also be turned off via the power down signal when the training phase is complete. In one embodiment, the predetermined threshold signal 204 (VREF), is generated by an internal power supply. For example, the predetermined threshold signal 204 may be generated by a similar resistor divider (e.g., reference generator) as used for the VCCIO voltage divider. Alternatively, the predetermined threshold signal 204 may be generated by an external power supply. In one embodiment, the predetermined threshold signal is approximately 0.9V. This means that, in one embodiment, a divided power-supply level above approximately 0.9V is considered a high-power-supply level while the divided power-supply level below the 0.9V level is considered a low-power-supply level. In one embodiment, the predetermined threshold is generated by devices other than the resistors.

In another embodiment, the predetermined threshold signal may be generated external to the processor by a reference generator and routed to the comparator 207.

In one embodiment, multiple comparators (not shown in FIG. 2) are used to compare multiple levels of power supplies (of VCCIO) with multiple predetermined threshold signals. A finer granularity or wider range of power-supply detection (i.e., 1.8V, 2.5V, 3.3V, 5.0V, etc.) may be implemented for finer control of the output driver's drive strength. The output of the multiple comparators may be multiplexed before it is input to predriver logic 208 of the adjustable output driver. In one embodiment, the multiplexer (not shown) is controlled by software or hardware or both.

The output of the comparator 201, in one embodiment, is stored in the latch 207 when the signal Rd_latch (CK) is asserted. The latch output is cleared via the chip-select signal, CS#, applied to the RST input of the latch. In one embodiment, the CS# signal is internally generated by logic. Alternatively, the chip-select signal is generated by other circuitry in the semiconductor device. In one embodiment, the latch 207 output is cleared when the training phase begins. The stored latch output, in one embodiment, is input to a predriver logic 208 (labeled as the power detect signal between the dynamic power supply detector 101 and the adjustable output driver 102 in FIG. 2). The predriver logic 208, in one embodiment, is configured to drive input signal Data_in to the output driver 209, which includes a pull-up driver 209a and a pull-down driver 209b. The output of the predriver logic 208, in one embodiment, is coupled with the pull-up 209a and pull-down 209b drivers of the output driver 209. The pull-up and pull-down drivers 209a-b may be multiple drivers that can be turned on or off independently by the predriver logic 208 via selection signals $S_{0-n}$ and $S'_{0-n}$.

In one embodiment, the pull-up and pull-down drivers 209a-b are binary weighted in size. In another embodiment, the pull-up and pull-down drivers 209a-b are thermometer weighted. The pull-up and pull-down drivers 209a-b may control the slew rate and output voltage levels (Voh, Vol) of the driving signal. Slew rate may be defined as the rising and falling speed, between 20% and 80% of signal swing, in nanoseconds (ns) of the signal driven by the output driver and measured at the pad 104. Output voltage levels Voh and Vol may be defined as DC levels (2.4v, 0.4v), or fractions of the power supply VCCIO level (0.7*VCCIO, 0.3*VCCIO).

The logic unit 206, in one embodiment, powers down the dynamic power supply detector 101 when the training phase is complete. The training phase, in one embodiment, includes the reading phase (also called read cycle) i.e. when the output buffer 209 is not driving or when the input buffer 103 is receiving signals (i.e., an instruction sequence). The output pd (pull-down) of the logic unit 206, in one embodiment, controls the power down transistor 203 that turns on or off the resistor divider. The same output power down (pd) signal may turn the comparator 207 on or off. The logic unit 206 can be designed using traditional logic gates. In other embodiments, the power down signal may be controlled using other circuitry external to the dynamic power supply detector 101.

Figure 3:
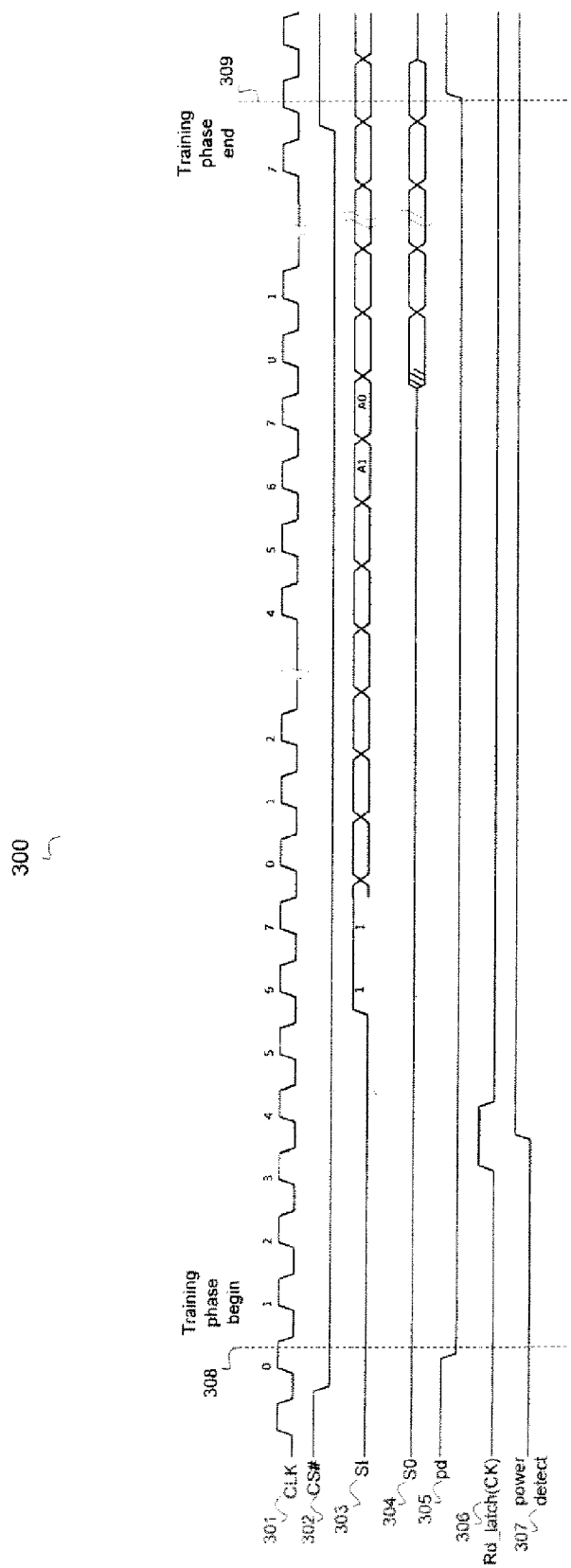
FIG. 3 illustrates a timing diagram, during a training phase, corresponding to the functional blocks shown in FIG. 2, according to an embodiment of the invention.

FIG. 3 shows the timing diagram 300 of the training phase, according to one embodiment of the invention. The signals in the timing diagram 300 may be internally generated. The CLK signal 301 is a periodic clock signal. In one embodiment, the CLK 301 operates at approximately 20 MHz frequency. Other clock speeds may be used for other embodiments. A phase locked loop (PLL) may be used to generate the CLK 301 signal. Alternatively, the CLK 301 signal may be generated by other clock sources. FIG. 3 illustrates, for simplicity of explanation, two of the predriver logic 208 output signals, $S_0$ 304 and $S_1$ 303. The power down signal pd 305 toggles when the training or the reading phase begins and ends. In one embodiment, when the pd 305 signal de-asserts (e.g., transitions from high to low), the training phase begins and ends when the pd 305 signal asserts (e.g., transitions from low to high). The beginning and ending of the training phase are shown by time marks 308 and 309 respectively. In another embodiment, the pd 305 signal function may be inverted to show the beginning and ending of the training phase.

During those phases, the pd signal 305 may turn on the dynamic power supply detector 101 which begins to detect the VCCIO level relative to the predetermined threshold. In one embodiment, when the training phase completes, the pd signal 305 turns off the dynamic power supply detector 101. The latch 207, in one embodiment, is reset by the chip-select signal 302 (CS#). The CS# signal 302 may trigger reset before the resistor divider, having resistors 202 and 203, and the comparator 201 are turned on by the power down (pd) signal 305. The Rd_latch signal 306, in one embodiment, is a pulse signal which is wide enough pulse for the latch 207 to store the output of the comparator 201 during the training phase. The power detect signal 307, in one embodiment, is the output of the latch 207. This power detect signal 307 may be received by the predriver logic 208 of the adjustable output driver 102 to determine what predriver signals to select to control the output driver's drive strength, and thus the slew rate.

Figure 4:
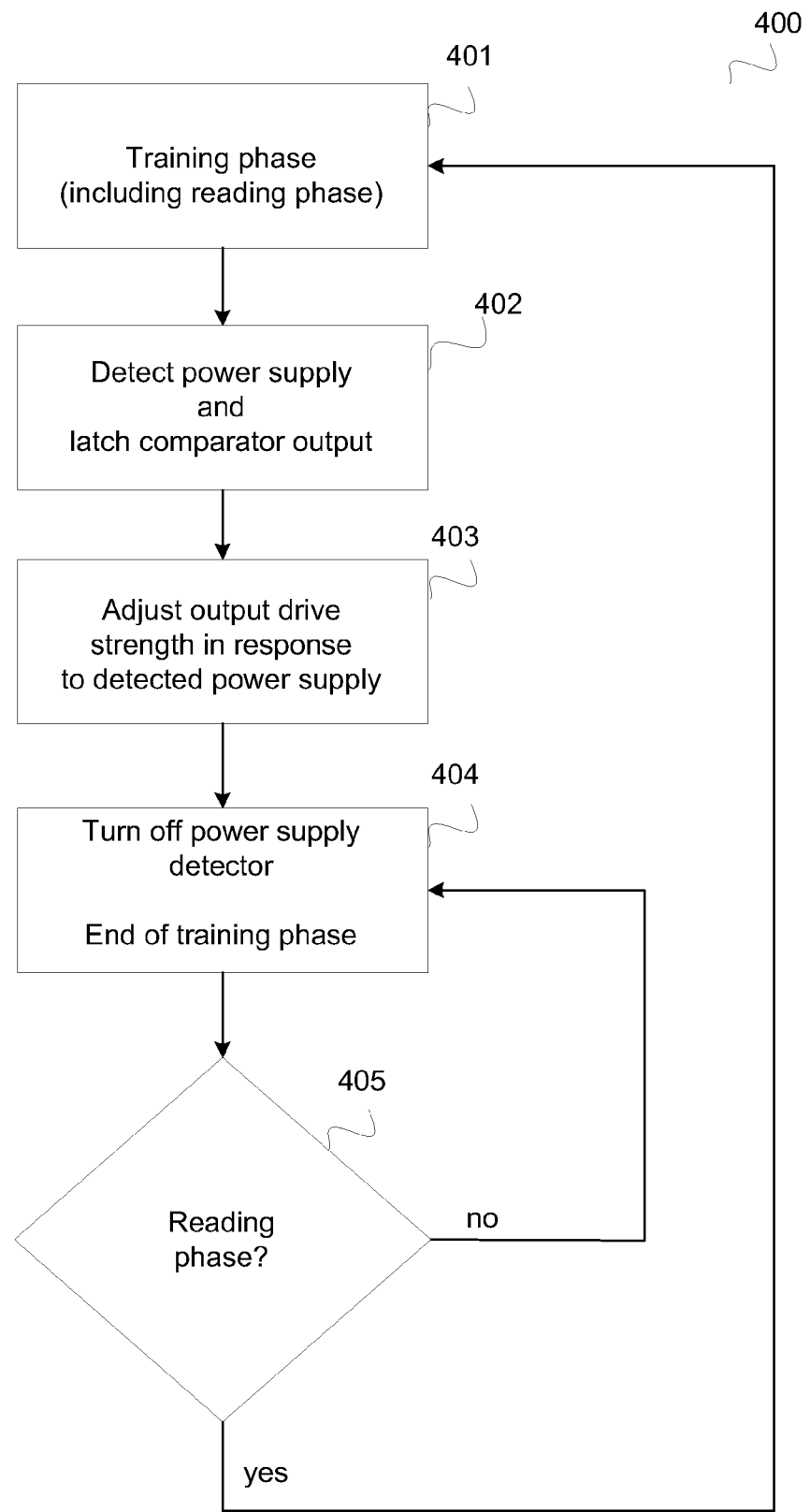
FIG. 4 illustrates a high-level flow chart for dynamically detecting a power-supply voltage level and adjusting the strength of an output buffer, according to an embodiment of the invention.

FIG. 4 illustrates a high-level flow chart 400 of the adjustable output driver with a dynamic power supply detector, according to one embodiment of the invention. At 401, training phase begins. The beginning of the training phase is also shown by the timing mark 308 of FIG. 3. In one embodiment, the training phase includes the reading phase. The training phase may last for several clock cycles. Referring back to FIG. 4, during the training phase at 402, the dynamic power supply detector 101 detects the power-supply level of VCCIO by comparing the divided power-supply level with a predetermined threshold level. In one embodiment, the comparison is performed by comparator 201 as shown in FIG. 2. Referring back to FIG. 4, at 402, the compared result from comparing the divided power-supply level with a predetermined threshold level is saved in the latch 207. At 403, the detected power-supply level determines the setting for the predriver logic 208. The settings of the predriver logic 208 may determine the output drive strength of the output driver 102. After setting the output driver's drive strength, the training phase ends at 404. At 404, the dynamic power supply detector 101 may be turned off to conserve power dissipation. Referring to FIG. 2 and FIG. 3, in one embodiment, the power supply detector is turned off by the power down (pd) signal 305 that controls the power down transistor 205. Referring back to FIG. 4, at 405, a determination is made about the operation of the I/O buffer (including 102 and 103). If the I/O buffer is in the reading phase then the power supply is detected again and the output buffer strength adjusted, if needed, in response to the detected power supply.

Referring to FIG. 1, in one embodiment, the I/O buffer (102 and 103) is in the reading phase when the output buffer 102 is not driving, but the input receiver 103 is receiving signal from transmission line 105 via pad/pin 104. The training phase, in one embodiment, restarts if the power-supply level changes drastically. A drastic change in power supply may result when the power supply changes from above the predetermined threshold level to a level below the predetermined threshold level. In one embodiment, a drastic change happens when the divided power-supply level of VCCIO drops below the predetermined threshold of 0.9V. Alternatively, other predetermined threshold values may be used.

Figure 5:
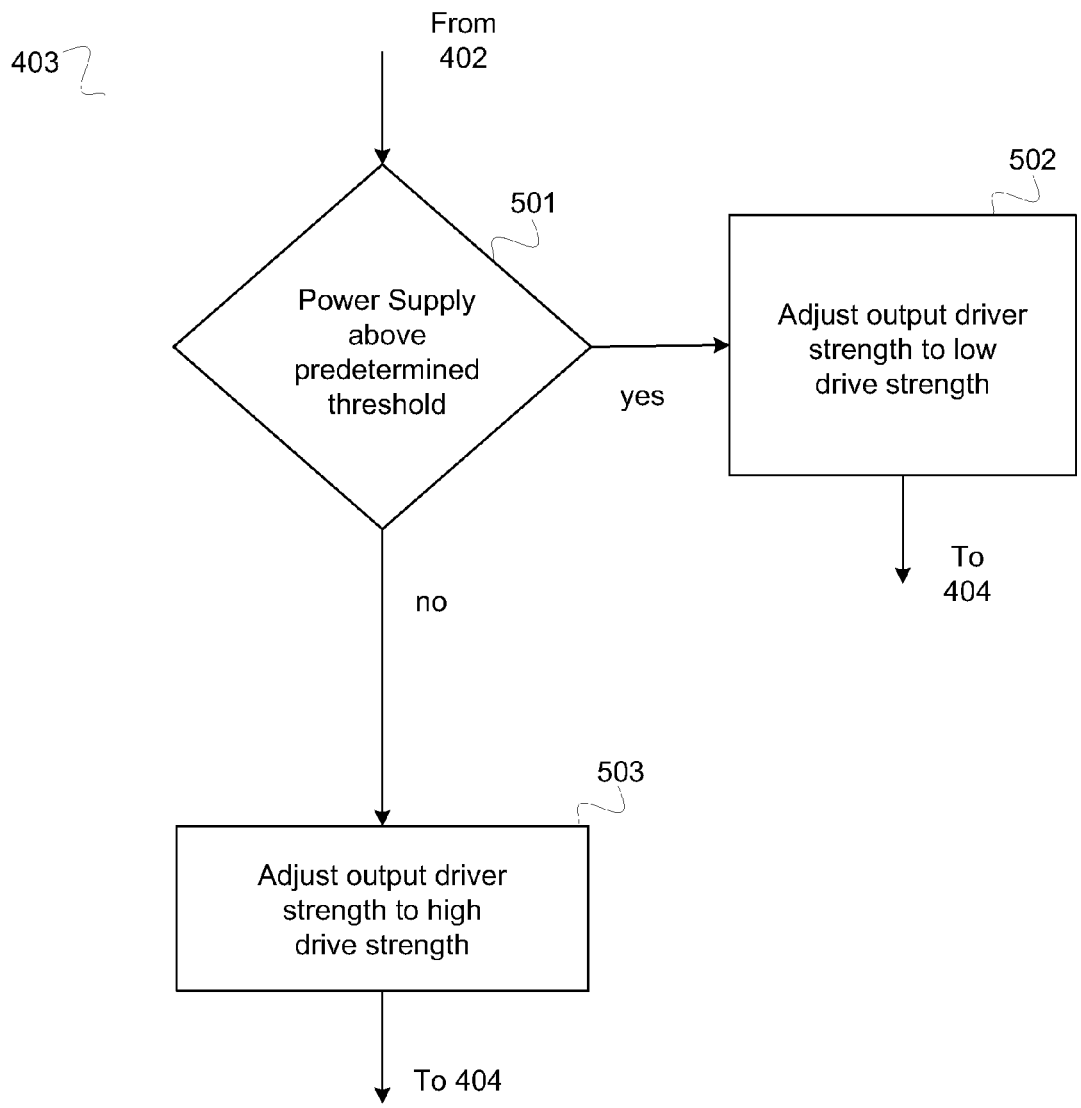
FIG. 5 illustrates a flow chart for adjusting the strength of the output buffer in response to the detected power-supply level, according to an embodiment of the invention.

FIG. 5 shows details of the step 403 in FIG. 4, according to one embodiment of the invention. At 501, a determination is made whether the divided power supply VCCIO is above or below the predetermined threshold value. This determination, in one embodiment, is made by the comparator 201 which compares the predetermined threshold value 204 with the divided power-supply level. If the divided power-supply level of VCCIO is above the predetermined threshold value, then block 502 is executed, otherwise block 503 is executed. At

502, the output driver strength is lowered. At 503, the output driver strength is raised. In one embodiment, the output driver's drive strength is set to drive a signal (Data_out on pin/pad 104 of FIG. 2) at slew rate of approximately 1.5 ns when the divided power-supply level is below the predetermined threshold of 0.9V. In another embodiment, the output driver's drive strength is set to drive the signal (Data_out) at a slew rate of approximately 10 ns when the divided power-supply level is above the predetermined threshold of 0.9V. In another embodiment, the output driver strength may be adjusted to maintain the same 1.5 ns slew rate at any power-supply voltage level VCCIO. By slowing the output driver (i.e. an output driver with a slew rate of 300 ps compared to a slew rate of 1.5 ns) at high-power-supply levels (i.e. VCCIO of 5.5V), noise characteristics such as ground bounce, overshoot, undershoot, etc., may be reduced.

Elements of embodiments are also provided as a machine-readable storage medium for storing the computer-executable instructions. The machine-readable medium may include, but is not limited to, any type of disk including floppy disks, optical disks, CD-ROMs, DVD ROMs, and magnetic-optical disks, read-only memories (ROMs), random access memories (RAMs), flash memory, EPROMs, EEPROMs, magnetic or optical cards, or any type of media suitable for storing electronic or computer-executable instructions of a computer program. Elements of embodiments may also be provided as machine-readable transmission medium. For example, embodiments of the invention such as the operations shown in FIGS. 4-5 may be downloaded as a computer program which may be transferred from a remote computer (e.g., a server) to a requesting computer (e.g., a client) by way of data signals via a communication link (e.g., a modem or network connection).

The embodiments discussed in FIGS. 1-5 allow a single device to interface with multiple interfaces operating over a wide range of power supplies in a power efficient manner. These embodiments reduce noise, such as ground bounce, on transmission lines by controlling the slew rate of the output driver at various power-supply levels. The embodiments described herein may allow for a short startup time, for example, 100 nsec (e.g., 8 clock cycles at approximately 80 MHz). Alternatively, other frequencies may be used that result in different startup times. The embodiments described herein may have a minimum active current of approximately 100 μA, and approximately zero standby current. Alternatively, the minimum active current and the standby current may be other values based on implementations of the design. It should also be noted that the embodiments described herein may be implemented to use existing control signals. The embodiments described herein may be used to control the output buffer strength to be proportional to the power-supply voltage level. In some embodiments, the dynamic power supply detector automatically selects the drive strength of the output driver on every read cycle. This may reduce the cost of designing and testing the semiconductor device in which the dynamic power supply detector. The embodiments described herein may operate over a wide range of power-supply voltages. In some embodiments, the operations described herein may be embedded inside normal serial clocking sequence, which may result in zero or minimal latency for serial devices. Also, since the dynamic power supply detector can detect multiple power-supply ranges, a single die having the dynamic power supply detector can be used to control multiple power-supply ranges, expanding the single dies ability to interface with more devices.

While the invention has been described in conjunction with specific embodiments thereof, many alternatives, modifications and variations will be apparent to those of ordinary skill in the art in light of the foregoing description. For example, various circuit topologies of the comparator 201 may be used for comparing the power-supply levels with the option of turning off for power savings. Similarly, the voltage divider circuit may be replaced with other known topologies that can operate over a wide power-supply range (for example, a range of approximately 1.65V-5.6V) Likewise, the latch 207 may be replaced by other storage devices. Similarly, the power supply detector may sample multiple power supplies VCCIO to control drive strength of different output buffers operating at different VCCIO supplies on the chip. The adjusting of the output drive strength, in one embodiment, is performed on an internal or external adjustable output buffer, where the internal adjustable output buffer drives signals inside the processor while the external output buffer drives signals to other processors or devices. The invention is intended to embrace all such alternatives, modifications, and variations as to fall within the broad scope of the appended claims.

What is claimed is:

1. An apparatus comprising:
a dynamic power supply detector configured to detect a power-supply voltage level relative to a predetermined threshold signal during a training phase including a reading phase;
an adjustable output buffer, coupled with the dynamic power supply detector, configured to adjust output drive strength during the training phase in response to the detected power-supply voltage level; and
a pull-up driver with an adjustable drive strength to drive a high voltage signal;
a pull-down driver, coupled with the pull-up driver, with an adjustable drive strength to drive a low voltage signal; and
wherein the pull-up and the pull-down drivers adjust their drive strength, at least in part, in response to the detected power-supply voltage level.

2. An apparatus comprising:
a dynamic power supply detector configured to detect a power-supply voltage level relative to a predetermined threshold signal during a training phase including a reading phase;
an adjustable output buffer, coupled with the dynamic power supply detector, configured to adjust output drive strength during the training phase in response to the detected power-supply voltage level;
a voltage divider to divide the power-supply voltage level;
a comparator, coupled with the voltage divider, to compare the divided power-supply voltage level with the predetermined threshold signal, wherein the comparator is operable to output a digital signal; and
a latch, coupled with the comparator, to store the digital output signal during the training phase.

3. The apparatus of claim 2, wherein the dynamic power supply detector further comprises:
a switch to turn off the voltage divider and the comparator in response to storing the digital output signal by the latch.

4. The apparatus of claim 1, wherein the detected power-supply voltage level is a low-power-supply voltage level when the power-supply voltage level is below the predetermined threshold signal, and wherein the detected power-supply voltage level is a high-power-supply voltage level when the power-supply voltage level is above the predetermined threshold signal.

5. The apparatus of claim 4, wherein the output drive strength of the adjustable output driver is set to high drive strength in response to detecting the low power-supply voltage level, and wherein the output drive strength of the adjustable output driver is set to low drive strength in response to detecting the high-power-supply voltage level.

6. The apparatus of claim 1, wherein the dynamic power supply detector is configured to detect the power-supply voltage level during every reading phase.

7. The apparatus of claim 1, wherein the dynamic power supply detector is configured to turn off when the adjustable output driver is driving a signal.

8. The apparatus of claim 1, further comprising a reference generator to generate the predetermined threshold signal.

9. A method comprising:
   detecting a power-supply voltage level, by a power supply detector, relative to a predetermined threshold signal during a training phase including a reading phase;
   adjusting output drive strength of an adjustable output buffer during the training phase in response to detecting the power-supply voltage level; and
   dividing the power-supply voltage level by a voltage divider;
   comparing, by a comparator, the divided power-supply voltage level with the predetermined threshold signal to generate a digital output signal; and
   storing, by a latch, the digital output signal during the training phase.

10. The method of claim 9, further comprising:
    turning off the voltage divider and the comparator in response to storing the digital output signal.

11. The method of claim 9, wherein detecting the power-supply voltage level comprises:
    detecting a low-power-supply voltage level when the divided power-supply voltage level is below the predetermined threshold signal; and
    detecting a high-power-supply voltage level when the divided power-supply is above the predetermined threshold signal.

12. The method of claim 11, further comprising:
    adjusting the output drive strength to high drive strength in response to detecting the low-power-supply voltage level; and
    adjusting the output drive strength to low drive strength in response to detecting the high-power-supply voltage level.

13. The method of claim 9, further comprising:
    adjusting the output drive strength on every reading phase.

14. The method of claim 9, further comprising:
    detecting the power-supply voltage level, by the dynamic power supply detector, during every reading phase; and
    adjusting the output driver strength by enabling pull-up and pull-down drivers of the adjustable output driver.

15. The method of claim 9, further comprising:
    detecting a multi-level range of power supply; and
    turning off the dynamic power supply detector in response to the adjustable output driver driving a signal.

16. The method of claim 9, further comprising generating the predetermined threshold signal by a reference generator.

17. A method for configuring a processor, the method comprising:
    detecting an environmental condition relative to a predetermined threshold signal during a training phase;
    turning on a dynamic power supply detector to detect the environmental condition including a power-supply voltage level;
    comparing the detected power-supply voltage level with the predetermined threshold signal to generate an output signal;
    adjusting output drive strength during the training phase in response to detecting the environmental condition;
    storing the output signal in a latch for adjusting the output drive strength; and
    turning off the dynamic power supply detector.

18. The method of claim 17, wherein the environmental condition includes:
    a power-supply voltage level; and
    temperature.

19. The method of claim 17, wherein the dynamic power supply detector is configured to turn off in response to an adjustable output driver driving a signal.

20. The method of claim 17, wherein adjusting the output drive strength during the training phase in response to detecting the environmental condition comprises:
    adjusting an adjustable output buffer.

21. The method of claim 17, wherein the detecting the environmental condition further comprises:
    detecting a multi-level range of a power-supply level.

22. The method of claim 17, further comprising:
    adjusting the output drive strength on every reading phase.

23. The method of claim 17, wherein the training phase includes a reading phase, and wherein the predetermined threshold signal is a voltage signal.

24. The method of claim 17, further comprising generating the predetermined threshold signal by a reference generator.

25. The apparatus of claim 2, wherein the detected power-supply voltage level is a low-power-supply voltage level when the power-supply voltage level is below the predetermined threshold signal, and wherein the detected power-supply voltage level is a high-power-supply voltage level when the power-supply voltage level is above the predetermined threshold signal.

26. The apparatus of claim 25, wherein the output drive strength of the adjustable output driver is set to high drive strength in response to detecting the low power-supply voltage level, and wherein the output drive strength of the adjustable output driver is set to low drive strength in response to detecting the high-power-supply voltage level.

27. The apparatus of claim 2, wherein the dynamic power supply detector is configured to detect the power-supply voltage level during every reading phase.

* * * * *